(12) United States Patent
Tsai et al.

(10) Patent No.: US 7,317,312 B1
(45) Date of Patent: Jan. 8, 2008

(54) GUIDE FOR TIP TO TRANSMISSION PATH CONTACT

(75) Inventors: Jason Victor Tsai, Tigard, OR (US); Julie A. Campbell, Beaverton, OR (US)

(73) Assignee: LeCroy Corporation, Chestnut Ridge, NY (US)

( * ) Notice: Subject to any disclaimer, the term of this patent is extended or adjusted under 35 U.S.C. 154(b) by 181 days.

(21) Appl. No.: 10/781,146

(22) Filed: Feb. 17, 2004

Related U.S. Application Data (60) Provisional application No. 60/447,851, filed on Feb. 14, 2003.

(51) Int. Cl.
*G01R 31/28* (2006.01)

(52) U.S. Cl. .................................. 324/158.1

(58) Field of Classification Search ................ 324/754, 324/755, 757, 758, 761, 765
See application file for complete search history.

(56) References Cited

U.S. PATENT DOCUMENTS

| | | | |
|---|---|---|---|
| 3,968,433 A | 7/1976 | Dobarganes | |
| 4,055,800 A | 10/1977 | Fisk et al. | |
| 4,061,969 A * | 12/1977 | Dean | 324/761 |
| 4,671,590 A | 6/1987 | Ignasiak | |
| 4,767,985 A | 8/1988 | Shearer, Jr. et al. | |
| 4,800,461 A | 1/1989 | Dixon et al. | |
| 4,996,476 A | 2/1991 | Balyasny et al. | |
| 5,015,946 A | 5/1991 | Janko | |
| 5,121,297 A | 6/1992 | Haas | |
| 5,166,609 A | 11/1992 | Cole et al. | |
| 5,202,622 A | 4/1993 | Cole et al. | |
| 5,387,872 A | 2/1995 | Nightingale | |
| 5,548,223 A | 8/1996 | Cole et al. | |
| 5,692,911 A | 12/1997 | Webster et al. | |
| 5,701,086 A | 12/1997 | Wardwell | |
| 5,955,888 A * | 9/1999 | Frederickson et al. | 324/761 |
| 6,191,594 B1 | 2/2001 | Nightingale et al. | |
| 6,208,155 B1 * | 3/2001 | Barabi et al. | 324/754 |
| 6,220,870 B1 * | 4/2001 | Barabi et al. | 439/71 |
| 6,281,692 B1 * | 8/2001 | Bodenweber et al. | 324/755 |
| 6,281,695 B1 | 8/2001 | Chung et al. | |
| 6,350,387 B2 | 2/2002 | Caron et al. | |
| 6,459,287 B1 | 10/2002 | Nightingale et al. | |
| 6,541,991 B1 * | 4/2003 | Hornchek, deceased et al. | 324/755 |

OTHER PUBLICATIONS

"Surface Mount Device Interconnects," Tektronix web page from www.tek.com, 8 sheets, at least as early as Feb. 13, 2004.

* cited by examiner

*Primary Examiner*—Jermele Hollington
(74) *Attorney, Agent, or Firm*—Law Office of Karen Dana Oster, LLC (57) ABSTRACT

A guide for tip to transmission path contact includes a guide insulator having at least one passageway defined therein. Each passageway has a tip passageway end and a transmission path passageway end. The tip passageway end is suitable for at least partially accommodating the tip of a probing head. The transmission path passageway end is suitable for at least partially accommodating a transmission path of a circuit board component. The tip contacts a transmission path through a passageway when the transmission path is positioned in the transmission path passageway end and the tip is positioned within the tip passageway end.

25 Claims, 8 Drawing Sheets

GUIDE FOR TIP TO TRANSMISSION PATH CONTACT

The present application is an application claiming the benefit under 35 USC Section 119(e) of U.S. Provisional Patent Application Ser. No. 60/447,851, filed Feb. 14, 2003. The present application is based on and claims priority from this application, the disclosure of which is incorporated herein by reference expressly.

BACKGROUND OF INVENTION

The present invention relates to a guide for tip to transmission path contact, and more specifically to a guide to facilitate relatively secure contact between an electrical test probe tip and transmission paths of circuit board components on a circuit board.

Typical modern circuit boards tend to include a variety of components (hereinafter referred to generally as "circuit board components"). Most of these circuit board components have leads (e.g. through-hole leads), legs, pins, pin headers, contact headers, or other transmission paths (hereinafter referred to as "transmission paths") though which electrical signals flow into and out of the circuit board components. These transmission paths may have a variety of shapes and sizes. Circuit board components often need to be monitored or tested by testing instruments such as oscilloscopes and other measuring, monitoring, diagnostic, and signal processing instruments. Other testing instruments may provide stimulus, act as the receiving component, or perhaps even provide some form of correction signal.

Electronic test probes may be used to provide an electrical connection between circuit board components and testing instruments. An electronic test probe generally consists of a probing head, a cable, and a connector. The probing head may have an integral or replaceable probing tip that is suitable for making an electronic contact with electrical components. The probing head is attached to a first end of the cable and the connector is attached to the opposite end of the cable. For purposes of this disclosure, test probe tips having multiple contact mechanisms (such as a differential test probe tip that would have two contact mechanisms) would be described as having at least one tip or as having multiple tips. It should also be noted that the term "tips" is not limited to electronic test probe tips, but may also include alternative types of test probe tips.

A conventional test probe tip is generally in the shape of a cone that narrows, much as a point of a pencil, becoming a sharp point. Differential probe tips have two points of contact. Still other probe tips have more points of contact. Test probe tips are usually made out of conductive metal such as copper, beryllium copper, nickel-palladium alloy, metal alloy, aluminum, steel, or a similar conductive material.

Conventional test probe tips can easily slip off transmission paths of circuit board components, especially pointed, rounded, or irregularly shaped transmission paths. After slipping off a circuit board component transmission path, the exposed conductive material on a conventional test probe tip may, for example, contact two transmission paths at the same time, cause an electrical short, and possibly damage the component.

U.S. Pat. No. 4,055,800 to Fisk et al. is directed to a test clip for electronic chips. The Fisk device is an integral plastic test clip that includes a pair of opposed jaws that are pivotal relative to each other about a junction and that are provided with inner elongated grooves radiating from the junction for the snug reception of the similarly located terminals of the chip and openings through which the clip communicates with the grooves to guide probes into direct contact with selected terminals. There are many problems with the Fisk device. For example, one problem with the Fisk device is that it is relatively complicated to produce because of its complicated shape. Another problem with the Fisk device is that its hinge element can easily break when it is being placed or removed on the chip. Yet another problem with the Fisk device is that different sized clips must be made for each size and shape chip. This could require the user to purchase and store an incredible number of different sized clips. Still another problem is that the Fisk device must contact both sides of the chip because it has to grip both sides. The gripping feature of the Fisk device can also cause problems with bending or breaking the terminals of the chip.

U.S. Pat. No. 4,767,985 to Shearer, Jr., et al. is directed to a claw grip contact probe for testing and diagnosing multi-lead electrical flat packs. The Shearer probe device includes a body and a sliding plate. The sliding plate contains two sets of holes into which are inserted spring-loaded electrical contact probes for making contact with the leads of the flat packs. The body includes comb teeth for orienting the body over the leads of the flat pack, as well as gripping means having hook ends for securely fastening the probe device to the flat pack being tested or diagnosed. The gripping means include an outwardly flared portion against which the sliding plate means exerts inward lateral pressure causing the hook ends to grip underneath the flat pack at each corner thereof to clamp it securely in place. There are many problems with the Shearer device. For example, one problem with the Shearer device is that it is relatively complicated to produce because of its two-part construction as well as the complicated shape of both parts. Another problem with the Shearer device is that its gripping means and hooks can easily break when the Shearer device is being placed or removed on the flat pack. Yet another problem with the Shearer device is that a different sized claw grip must be made for each size and shape flat pack. This could require the user to purchase and store an incredible number of different sized claw grips. Still another problem is that the Shearer device must contact both sides of the flat pack because it has to grip both sides. The gripping feature of the Shearer device can also cause problems with bending or breaking the leads of the flat pack.

U.S. Pat. No. 6,281,695 to Chung, et al. is directed to an integrated circuit package pin indicator that may include probe guides. The Chung indicator includes a top marking plate with indicia for the multiple pins of the IC package. Each pin marker terminates in a hole or slot that is adapted to guide a probe to a selected pin. There are many problems with the Chung indicator. For example, one problem with the Chung indicator is that it must be made for each size and shape IC package. This could require the user to purchase and store an incredible number of different sized indicators. Still another problem is that the Chung indicator contacts all sides of the IC package.

U.S. Pat. No. 5,387,872 to Nightingale is directed to a positioning aid for a hand-held electrical test probe for directly positioning a hand-held electrical test probe onto leads of a surface mounted IC. The Nightingale positioning aid has a housing with a central bore therethrough for receiving the probing tip of the test probe. One end of the housing, which is normal to the central bore, has at least four teeth extending therefrom defining slots for engaging the leads of the IC. The central bore is exposed in the central slot of the housing for exposing the probing tip therein for providing an electrical connection between one of the leads on the IC and the electrical circuitry of the probing head. There are many problems with the Nightingale positioning aid. For example, one problem with the Nightingale positioning aid is that it must be positioned on the IC leads each time it is to be used. Although this feature makes it convenient for probing multiple different IC leads, it is inconvenient if the Nightingale positioning aid must be repositioned each time a particularly relevant IC lead is to be probed. Another problem is that the Nightingale positioning aid is attached to the probing tip and must be removed each time the probing tip is to be used to probe something other than the lead of a surface mounted IC.

BRIEF SUMMARY OF THE INVENTION

The present invention relates to a guide for tip to transmission path contact, and more specifically to a guide to provide relatively secure contact between an electrical test probe tip and transmission paths of circuit board components on a circuit board.

A guide for tip to transmission path contact includes a guide insulator having at least one passageway defined therein. The at least one passageway has a tip passageway end and a transmission path passageway end. The tip passageway end is suitable for at least partially accommodating the tip of a probing head. The transmission path passageway end is suitable for at least partially accommodating a transmission path of a circuit board component. The tip contacts a transmission path through a passageway when the transmission path is positioned in the transmission path passageway end and the tip is positioned within the tip passageway end.

Some embodiments of the present invention include a tip passageway end that guides the tip towards the transmission path using a guide enhancing mechanism.

Some embodiments of the present invention include a contact enhancing mechanism, the tip indirectly contacting the transmission path via the contact enhancing mechanism.

Some embodiments of the present invention include a mounting apparatus and at least one divider guide insulator.

In some embodiments of the present invention, two guide insulators may be adjustable in relation to each other.

The foregoing and other objectives, features, and advantages of the invention will be more readily understood upon consideration of the following detailed description of the invention, taken in conjunction with the accompanying drawings.

DETAILED DESCRIPTION OF THE INVENTION

The present invention relates to a guide 20 that may guide, lead, and/or direct a tip 22 towards a transmission path 24. For purposes of simplicity, the general term "guide 20" will be used when referring to all guide embodiments including those designated with 20*a*–20*j*. This feature allows more accurate placement of a tip 22 on a transmission path 24. The guide 20 of the present invention may also facilitate a relatively secure contact between a tip 22 and a transmission path 24. It should be noted that "relatively secure" is relative as compared to contact made without the guide 20. Accordingly, the contact does not have to be firm or secured, but only has to help the user make and maintain the contact between the tip 22 and the transmission path 24. As mentioned, conventional tips 22 can easily slip off transmission paths 24 of circuit board components 26, especially pointed, rounded, or irregularly shaped transmission paths 24. By facilitating a relatively secure contact between a tip 22 and a transmission path 24, the guide 20 of the present invention helps to prevent such slipping. After slipping off a transmission path 24, the exposed conductive material on a conventional tip 22 may contact, for example, two transmission paths 24 at the same time and cause an electrical short and possibly damage the component. By facilitating a relatively secure contact between a tip 22 and a transmission path 24, the guide 20 of the present invention helps to prevent such short-circuiting and the damage it may cause. The guide 20 may also have general protection properties such as protecting transmission paths 24 from damage caused by accidental probing, dropping of heavy items thereon, dropping of conductive items thereon, or any contacting that is unwanted.

For the purposes of this invention, a tip 22 may be, for example, any device that may be used as an input for a test probe. For the purposes of this invention, transmission paths 24 may be, for example, leads (e.g. through-hole leads), legs, pins, pin headers, contact headers, or other transmission paths through which electrical signals flow into and out of the circuit board components 26.

The guide 20 preferably includes at least one guide insulator 30 having at least one insulated exterior surface 32. For purposes of simplicity, the general term "guide insulator 30" will be used when referring to all guide insulator embodiments including those designated with 30a–30j. The insulated exterior surface 32 prevents short-circuiting with adjacent transmission paths 24 and/or circuit board components 26. The guide insulator(s) 30 defines at least one passageway or bore 34 such that each passageway 34 has a first tip passageway end 36 and a second transmission path passageway end 38. In some embodiments, the first tip passageway end 36 is directly opposite the second transmission path passageway end 38. In alternative embodiments, the first tip passageway end 36 is not directly opposite the second transmission path passageway end 38. The first passageway end 36 is suitable for accommodating a tip 22. The second passageway end 38 is suitable for accommodating a transmission path 24. The tip 22 contacts the transmission path 24 through the passageway 34 when the tip 22 is positioned in the first passageway end 36 and the transmission path 24 is positioned within the second passageway end 38.

The guide 20 may also include a contact enhancing mechanism. For example, in shown exemplary embodiments of FIGS. 6–8, the at least one passageway 34 includes a contact enhancing mechanism such as a disc or plate that floats substantially perpendicular within the passageway 34 of a clamshell-like insulator 30.

In one preferred embodiment, the guide 20 may be interconnected with a circuit board component having at least one transmission path 24. The interconnection may be removable. Although it may be removable, in practice, a user might leave the guide 20 on a particularly relevant transmission path 24. This would allow easy probing and reprobing of that particularly relevant transmission path 24. A user would be able to position a few of the guides 20 on a circuit board and then, using a single probe tip, easily probe and reprobe transmission paths 24 having the guides 20 thereon.

In some of the shown embodiments, the guide 20 is interconnected with a circuit board component having at least one transmission path 24 by positioning the at least one transmission path 24 at least partially within a respective second passageway end 38 of the at least one passageway 34. One advantage of inserting a transmission path 24 within the second passageway end 38 is that it helps to stabilize the guide 20. In some of the embodiments of the present invention, this stabilization eliminates the need for additional attachment or securing mechanisms. It should be noted that additional attachment or securing mechanisms are often expensive to produce, easily break, and/or limit the size and shape of the circuit board component to which the guide 20 can be attached. Another advantage of inserting a transmission path 24 within the second passageway end 38 is that it helps to prevent accidental short circuits or unwanted probing caused by a tip 22 accidentally touching adjacent transmission paths 24.

The advantages of inserting a transmission path 24 within the second passageway end 38 can be seen by comparing it to the probe guides disclosed in U.S. Pat. No. 6,281,695 to Chung, et al. The Chung indicator is an integrated circuit package pin indicator that may include probe guides. The Chung probe guides are holes or slots in the top plate that lay over pins of the integrated circuit package. Without the legs and projections that are used to hold the Chung indicator to the integrated circuit package, the top plate would simply slip off. These legs and projections, however, limit the integrated circuit packages to which the Chung indicator can mate to a particular size and shape. In addition, a particularly fine and/or flexible tip 22 could slip under the Chung top plate and accidentally touch adjacent transmission paths 24.

For exemplary purposes only, a guide 20 may have two passageways 34 such that it accommodates two transmission paths 24 and two tips 22. A guide 20 having two passageways 34 would be suitable for use when a user may want to use a differential test probe having two tips 22 to monitor or test the signal between two transmission paths 24. To do this the user would place the guide 20 over the transmission paths 24 to be monitored or tested by inserting the transmission paths 24 through the second passageway end 38 such that the transmission paths 24 are accessible through the passageway 34. The user would then insert each of the tips 22 into respective first passageway ends 36 opposite the respective transmission paths 24. Depending on the configuration, the two tips 22 would electrically contact directly or indirectly the two transmission paths 24 through the passageway 34. In one preferred embodiment the first tip passageway end 36 of the passageways 34 is channeled such that the tips 22 easily slide into the passageways 34 and are guided into contact with the transmission paths 24.

Figure 1:
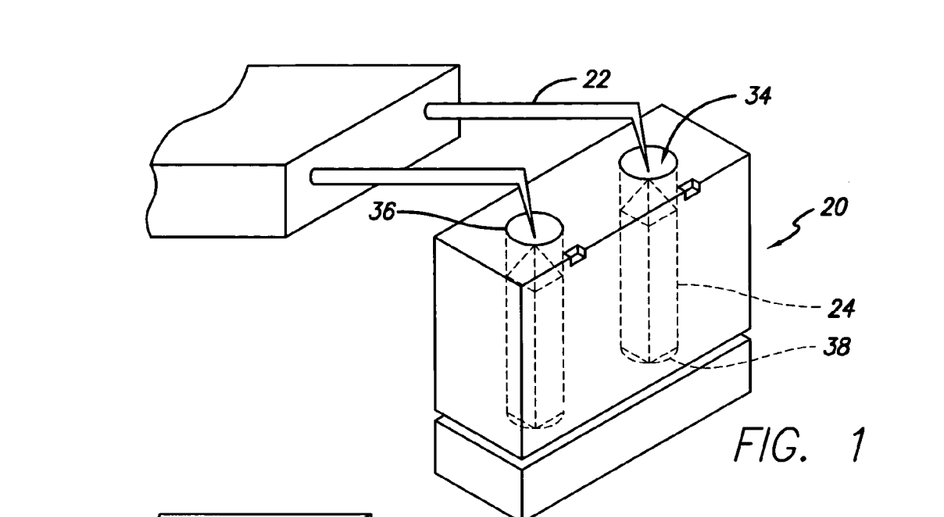
FIG. 1 is a perspective view of a first exemplary guide of the present invention guiding a tip towards a transmission path (shown in phantom).
Figure 2:
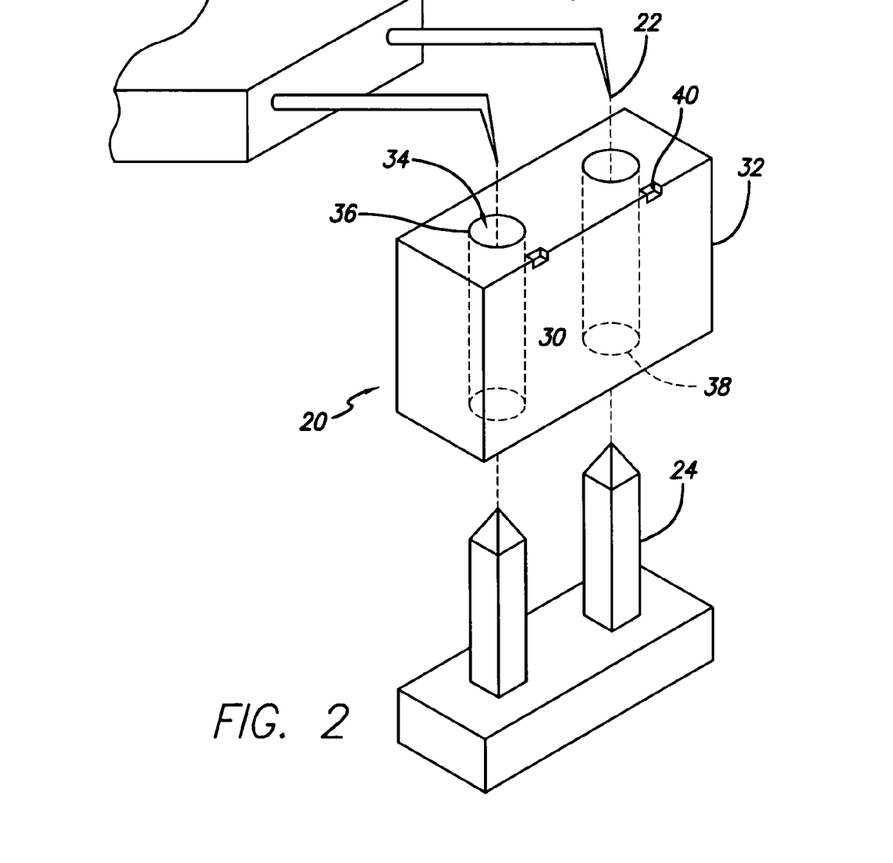
FIG. 2 is an exploded view of the first exemplary guide of the present invention shown in FIG. 1.

FIGS. 1–2 show a first exemplary guide 20 of the present invention guiding a tip towards a transmission path 24 (shown in phantom). The guide 20 includes a guide insulator 30 having an insulated exterior surface 32. The insulated exterior surface 32 prevents short-circuiting with adjacent transmission paths 24. The guide insulator 30 defines two straight passageways 34. Each passageway 34 has a first tip passageway end 36 and a second transmission path passageway end 38. In this embodiment, the first tip passageway end 36 is directly opposite the second transmission path passageway end 38. The first passageway end 36 is suitable for accommodating a tip 22. The second passageway end 38 is suitable for accommodating a transmission path 24. In this embodiment, the suitability for accommodating both the tip 22 and the transmission path 24 within the passageway 34 is at least partially achieved by the shape and thickness of the guide insulator 30. In this embodiment, the ability to accommodate both the tip 22 and the transmission path 24 within the passageway allows this embodiment to be securely positioned without additional securing apparatus. The tip 22 contacts the transmission path 24 through the passageway 34 when the tip 22 is positioned in the first passageway end 36 and the transmission path 24 is positioned within the second passageway end 38. This exemplary embodiment shows two distance notches 40 that may be used to adjust the distance between or spacing of two probe tips without risking accidental contact with the transmission paths 24. Alternative embodiments of this embodiment may include only a single passageway 34 or more than two passageways 34.

Figure 3:
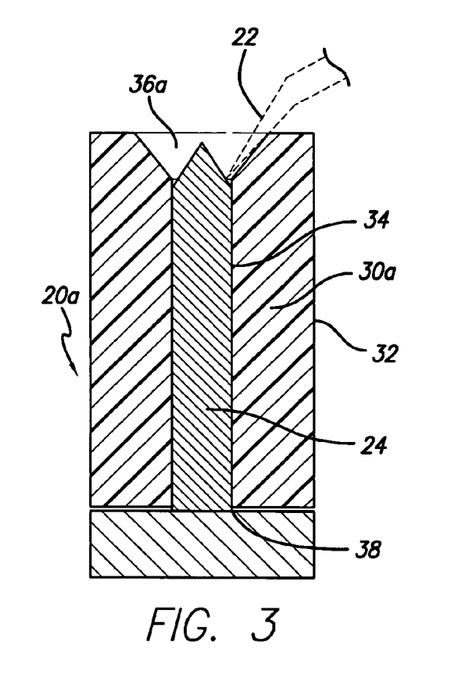
FIG. 3 is a cross-sectional view of a second exemplary embodiment of a guide of the present invention having a funnel shaped opening or first tip passageway end on the top guide surface.
Figure 13:
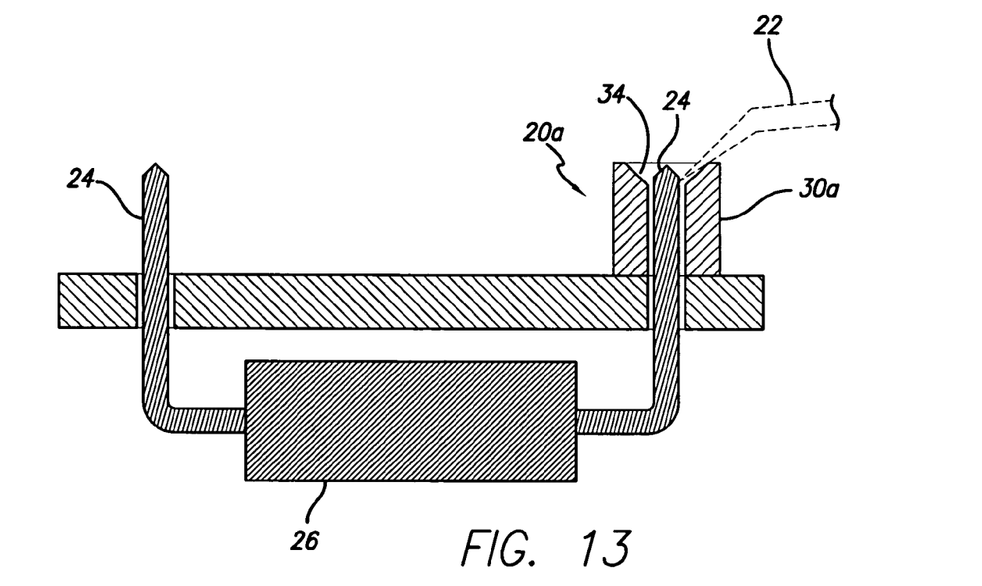
FIG. 13 is a cross-sectional view of the second exemplary embodiment of a guide shown in FIG. 3 positioned on a through-hole lead of a circuit board component.

FIG. 3 shows a second exemplary embodiment of a guide 20a of the present invention having a funnel shaped opening or first tip passageway end 36a on the top guide surface. Specifically, the guide 20a includes a guide insulator 30a having an insulated exterior surface 32. The insulated exterior surface 32 prevents short-circuiting with adjacent transmission paths 24. The guide insulator 30a defines a passageway 34. Each passageway 34 has a first tip passageway end 36a and a second transmission path passageway end 38. In this embodiment, the first tip passageway end 36a is directly opposite the second transmission path passageway end 38. The first passageway end 36a is suitable for accommodating a tip 22. The funnel shape of the first tip passageway end 36a would help to guide and secure the tip 22 within the first tip passageway end 36a. The second passageway end 38 is suitable for accommodating a transmission path 24. The tip 22 contacts the transmission path 24 through the passageway 34 when the tip 22 is positioned in the first passageway end 36a and the transmission path 24 is positioned within the second passageway end 38. As with the embodiment shown in FIGS. 1–2, the shape and thickness of the guide insulator 30a are at least partially responsible for enabling this embodiment to be securely positioned without additional securing apparatus and, further, for allowing both the tip 22 and the transmission path 24 to be accommodated within the passageway 34. Alternative embodiments of this embodiment may include multiple passageways 34. FIG. 13 shows this embodiment positioned on a through-hole lead of a circuit board component 26.

Figure 4:
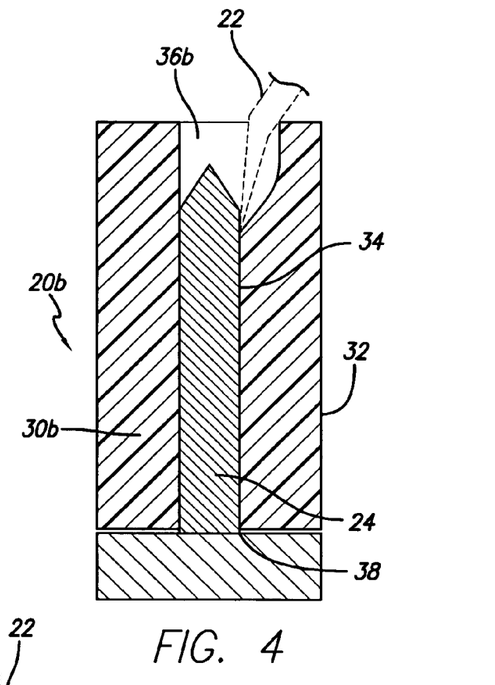
FIG. 4 is a cross-sectional view of a third exemplary embodiment of a guide of the present invention having an enlarged, partial funnel shaped opening or first tip passageway end on the top guide surface.

FIG. 4 shows a third exemplary embodiment of a guide 20b of the present invention having an enlarged, partial funnel shaped opening or first tip passageway end 36b on the top guide surface. Specifically, the guide 20b includes a guide insulator 30b having an insulated exterior surface 32. The insulated exterior surface 32 prevents short-circuiting with adjacent transmission paths 24. The guide insulator 30b defines a passageway 34. Each passageway 34 has a first tip passageway end 36b and a second transmission path passageway end 38. In this embodiment, the first tip passageway end 36b is directly opposite the second transmission path passageway end 38. The first passageway end 36b is suitable for accommodating a tip 22. The partial funnel shape of the first tip passageway end 36b would help to guide and secure the tip 22 within the first tip passageway end 36b. The second passageway end 38 is suitable for accommodating a transmission path 24. The tip 22 contacts the transmission path 24 through the passageway 34 when the tip 22 is positioned in the first passageway end 36b and the transmission path 24 is positioned within the second passageway end 38. As with the embodiment shown in FIGS. 1–2, the shape and thickness of the guide insulator 30b are at least partially responsible for enabling this embodiment to be securely positioned without additional securing apparatus and, further, for allowing both the tip 22 and the transmission path 24 to be accommodated within the passageway 34. Alternative embodiments of this embodiment may include multiple passageways 34. For example, if two passageways 34 are used in this embodiment and the partial funnel shape is on the outer sides of the two passageways 34, two tips could be entered with a wide spacing in the partial funnel shape and then narrowed to make contact with the transmission paths 24.

Figure 5:
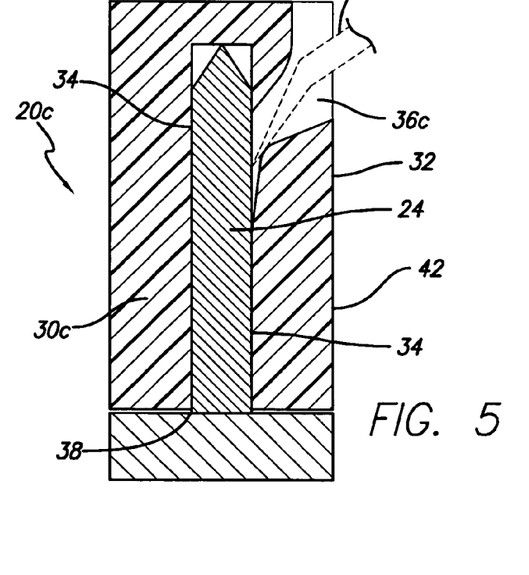
FIG. 5 is a cross-sectional view of a fourth exemplary embodiment of a guide of the present invention having an opening or first tip passageway end on the peripheral guide surface.

FIG. 5 shows a fourth exemplary embodiment of a guide 20c of the present invention having an opening or first tip passageway end 36c on the peripheral guide surface 42. Specifically, the guide 20c includes a guide insulator 30c having an insulated exterior surface 32. The insulated exterior surface 32 prevents short-circuiting with adjacent transmission paths 24. The guide insulator 30c defines a passageway 34. Each passageway 34 has a first tip passageway end 36c and a second transmission path passageway end 38. In this embodiment, the first tip passageway end 36c is not directly opposite the second transmission path passageway end 38. The first passageway end 36c is suitable for accommodating a tip 22. The first tip passageway end 36c would help to guide and secure the tip 22 within the first tip passageway end 36c. The second passageway end 38 is suitable for accommodating a transmission path 24. The tip 22 contacts the transmission path 24 through the passageway 34 when the tip 22 is positioned in the first passageway end 36c and the transmission path 24 is positioned within the second passageway end 38. As with the embodiment shown in FIGS. 1–2, the shape and thickness of the guide insulator 30c are at least partially responsible for enabling this embodiment to be securely positioned without additional securing apparatus and, further, for allowing both the tip 22 and the transmission path 24 to be accommodated within the passageway 34. One advantage of the first tip passageway end 36c being on the peripheral guide surface 42 is that it provides greater protection from damage caused by accidental probing, dropping of heavy items thereon, dropping of conductive items thereon, or any contacting that is unwanted. Alternative embodiments of this embodiment may include multiple passageways 34.

Figure 6:
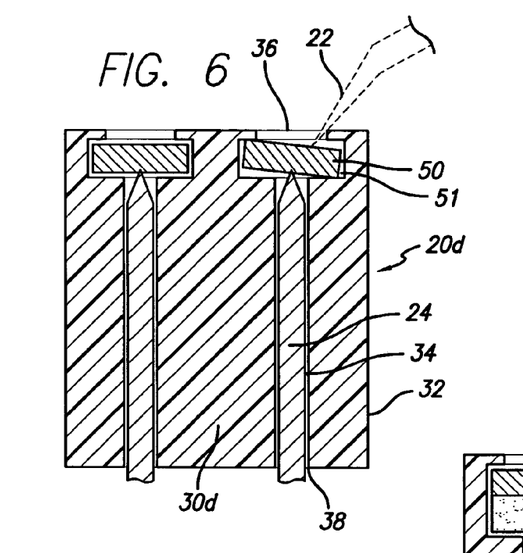
FIG. 6 is a cross-sectional view of a fifth exemplary embodiment of a guide of the present invention having a solid contact enhancing mechanism.

FIG. 6 shows a fifth exemplary embodiment of a guide 20d of the present invention having a solid contact enhancing mechanism 50 positioned within a contact enhancing mechanism compartment 51. The solid contact enhancing mechanism 50 may be made from metal or any conductive material. In one preferred embodiment, the contact enhancing mechanism 50 is a disc or plate that floats substantially perpendicular within the passageway 34 of a clamshell-like guide insulator 30d that may tilt when a tip 22 puts pressure thereon. In this embodiment, the guide 20d includes a guide insulator 30d having an insulated exterior surface 32. The insulated exterior surface 32 prevents short-circuiting with adjacent transmission paths 24. The guide insulator 30d defines a passageway 34. Each passageway 34 has a first tip passageway end 36 and a second transmission path passageway end 38. In this embodiment, the first tip passageway end 36 is directly opposite the second transmission path passageway end 38 and the contact enhancing mechanism compartment 51 is positioned therebetween. The first passageway end 36 is suitable for accommodating a tip 22. The first tip passageway end 36 would help to guide and secure the tip 22 within the first tip passageway end 36. The second passageway end 38 is suitable for accommodating a transmission path 24. The tip 22 positioned in the first tip passageway end 36 contacts one side of the contact enhancing mechanism 50 and the transmission path 24 positioned within the second passageway end 38 contacts the other side of the contact enhancing mechanism 50 to form an electrical connection between the tip 22 and the transmission path 24. As with the embodiment shown in FIGS. 1–2, the shape and thickness of the guide insulator 30d are at least partially responsible for enabling this embodiment to be securely positioned without additional securing apparatus and, further, for allowing both the tip 22 and the transmission path 24 to be accommodated within the passageway 34. Although shown with two passageways, alternative embodiments of this embodiment may include only one passageway 34 or many passageways 34.

Figure 7:
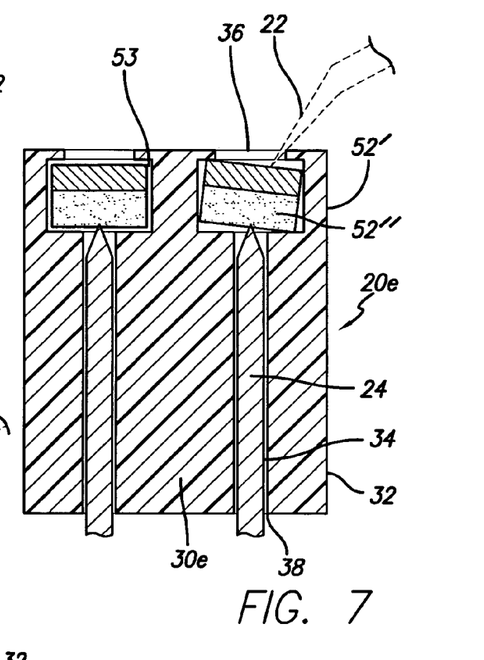
FIG. 7 is a cross-sectional view of a sixth exemplary embodiment of a guide of the present invention having a combination contact enhancing mechanism.

FIG. 7 shows a sixth exemplary embodiment of a guide 20e of the present invention having a combination contact enhancing mechanism 52', 52" positioned within a contact enhancing mechanism compartment 53. The combination contact enhancing mechanism 52', 52" may be made from metal or any conductive material with a coating or additional layer attached thereto. The combination contact enhancing mechanism 52', 52" may have additional layers, layers of different thicknesses, and/or layers of different types (e.g. a soft layer may be above a solid layer). In one preferred embodiment the contact enhancing mechanism 52', 52" is a disc or plate that floats substantially perpendicular within the passageway 34 of a clamshell-like guide insulator 30e that may tilt when a tip 22 puts pressure thereon. In this embodiment, the guide 20e includes a guide insulator 30e having an insulated exterior surface 32. The insulated exterior surface 32 prevents short-circuiting with adjacent transmission paths 24. The guide insulator 30e defines a passageway 34. Each passageway 34 has a first tip passageway end 36 and a second transmission path passageway end 38. In this embodiment, the first tip passageway end 36 is directly opposite the second transmission path passageway end 38 and the contact enhancing mechanism compartment 53 is positioned therebetween. The first passageway end 36 is suitable for accommodating a tip 22. The first tip passageway end 36 would help to guide and secure the tip 22 within the first tip passageway end 36. The second passageway end 38 is suitable for accommodating a transmission path 24. The tip 22 positioned in the first tip passageway end 36 contacts one side of the contact enhancing mechanism 52', 52" and the transmission path 24 positioned within the second passageway end 38 contacts the other side of the contact enhancing mechanism 52', 52" to form an electrical connection between the tip 22 and the transmission path 24. As with the embodiment shown in FIGS. 1–2, the shape and thickness of the guide insulator 30e are at least partially responsible for enabling this embodiment to be securely positioned without additional securing apparatus and, further, for allowing both the tip 22 and the transmission path 24 to be accommodated within the passageway 34. Although shown with two passageways, alternative embodiments of this embodiment may include only one passageway 34 or many passageways 34.

Figure 8:
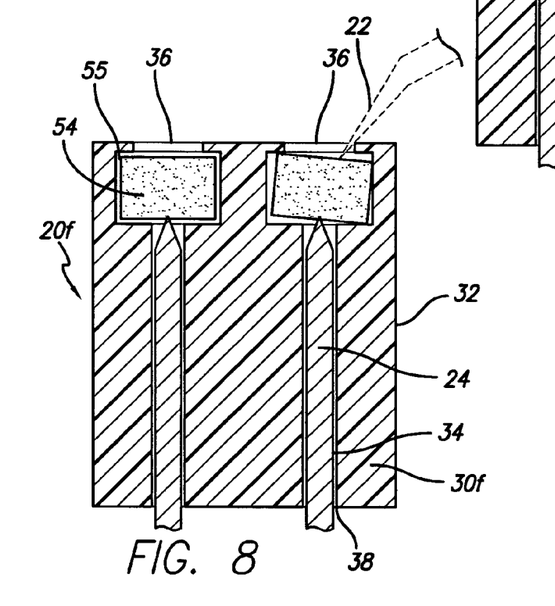
FIG. 8 is a cross-sectional view of a seventh exemplary embodiment of a guide of the present invention having a soft contact enhancing mechanism.

FIG. 8 shows a seventh exemplary embodiment of a guide 20f of the present invention having a soft contact enhancing mechanism 54 positioned within a contact enhancing mechanism compartment 55. The soft contact enhancing mechanism 54 may be made from a resistive elastomer or other soft contact mechanism. One advantage of the contact enhancing mechanism 54 being soft is that it might help to secure the tip 22 within the first tip passageway end 36. In one preferred embodiment the contact enhancing mechanism 54 is a disc or plate that floats substantially perpendicular within the passageway 34 of a clamshell-like guide insulator 30f that may tilt when a tip 22 puts pressure thereon. In this embodiment, the guide 20f includes a guide insulator 30f having an insulated exterior surface 32. The insulated exterior surface 32 prevents short-circuiting with adjacent transmission paths 24. The guide insulator 30f defines a passageway 34. Each passageway 34 has a first tip passageway end 36 and a second transmission path passageway end 38. In this embodiment, the first tip passageway end 36 is directly opposite the second transmission path passageway end 38 and the contact enhancing mechanism compartment 55 is positioned therebetween. The first passageway end 36 is suitable for accommodating a tip 22. The first tip passageway end 36 would help to guide and secure the tip 22 within the first tip passageway end 36. The second passageway end 38 is suitable for accommodating a transmission path 24. The tip 22 positioned in the first tip passageway end 36 contacts one side of the contact enhancing mechanism 54 and the transmission path 24 positioned within the second passageway end 38 contacts the other side of the contact enhancing mechanism 54 to form an electrical connection between the tip 22 and the transmission path 24. As with the embodiment shown in FIGS. 1–2, the shape and thickness of the guide insulator 30f are at least partially responsible for enabling this embodiment to be securely positioned without additional securing apparatus and, further, for allowing both the tip 22 and the transmission path 24 to be accommodated within the passageway 34. Although shown with two passageways, alternative embodiments of this embodiment may include only one passageway 34 or many passageways 34.

Figure 9:
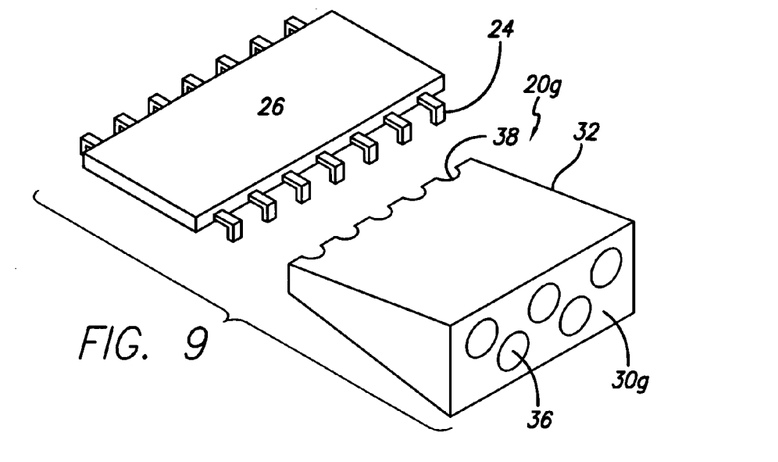
FIG. 9 is an exploded view of an eighth exemplary embodiment of a guide of the present invention having multiple passageways in a staggered configuration for use with a circuit board component having multiple transmission paths.
Figure 10:
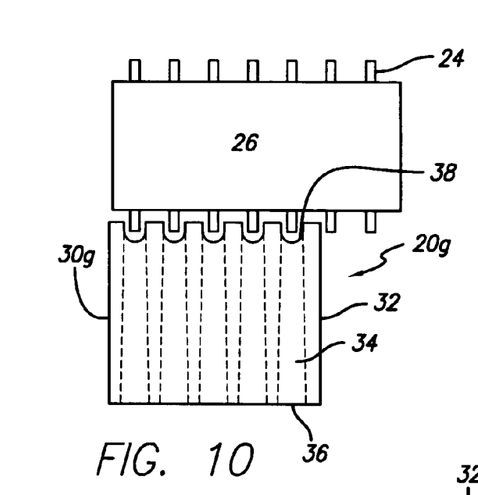
FIG. 10 is a top view of the eighth exemplary embodiment of a guide shown in FIG. 9 in mating relationship with the circuit board component.

FIGS. 9 and 10 show an eighth exemplary embodiment of a guide 20g of the present invention having multiple passageways 24 in a staggered configuration for use with a circuit board component 26 having multiple transmission paths 24. Specifically, the guide 20g includes a guide insulator 30g that defines at least one passageway 34. This embodiment would function in much the same manner as the aforementioned examples, but would be particularly suitable for use with a relatively flat circuit board component 26. This embodiment would take into consideration that circuit boards are often vertically (parallel above and below the circuit board, regardless of actual orientation) tightly packed together such that it is undesirable to add height to a circuit board component 26 by stacking additional items thereon. This embodiment may also be able to provide access to a circuit board component 26 that is hard to access because of limited vertical space. This embodiment would also take into consideration that circuit boards have limited horizontal real estate (as opposed to the embodiment shown in FIG. 11). Accordingly, alternative embodiments could be narrower and/or staggered in more than two lines. An extreme example would have transmission paths 24 that translate between a complete horizontal to a complete vertical. It should be noted that alternative embodiments might partially or completely cover the transmission paths 24 for added protection.

Figure 11:
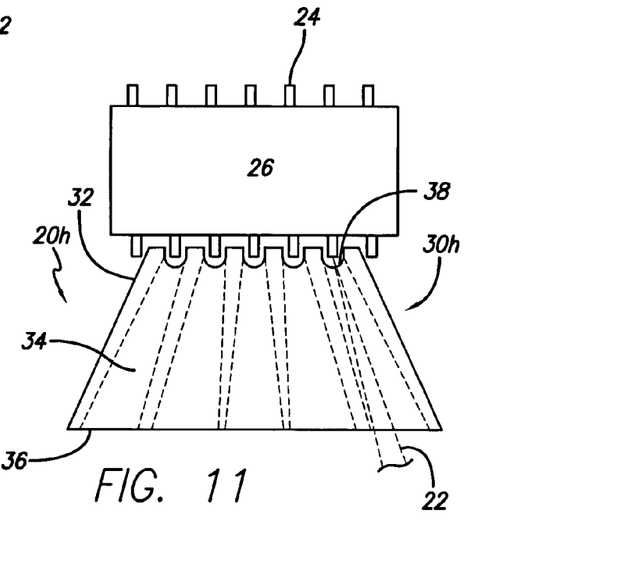
FIG. 11 is a top view of a ninth exemplary embodiment of a guide of the present invention having multiple passageways in a fanned out configuration for use with a circuit board component having multiple transmission paths.

FIG. 11 shows a ninth exemplary embodiment of a guide 20h of the present invention having multiple passageways 24 in a fanned out configuration for use with a circuit board component 26 having multiple transmission paths 24. Specifically, the guide 20h includes a guide insulator 30h that defines at least one passageway 34. This embodiment would function in much the same manner as the aforementioned examples, but would be particularly suitable for use with a relatively flat circuit board component 26. This embodiment would take into consideration that circuit boards are often vertically (parallel above and below the circuit board, regardless of actual orientation) tightly packed together such that it is undesirable to add height to a circuit board component 26 by stacking additional items thereon. This embodiment may also be able to provide access to a circuit board component 26 that is hard to access because of limited vertical space. In other words, this embodiment would be particularly suitable for circuit board components 26 that are so vertically close together that they are almost cannot be probed. It should be noted that alternative embodiments might partially or completely cover the transmission paths 24 for added protection.

Figure 12:
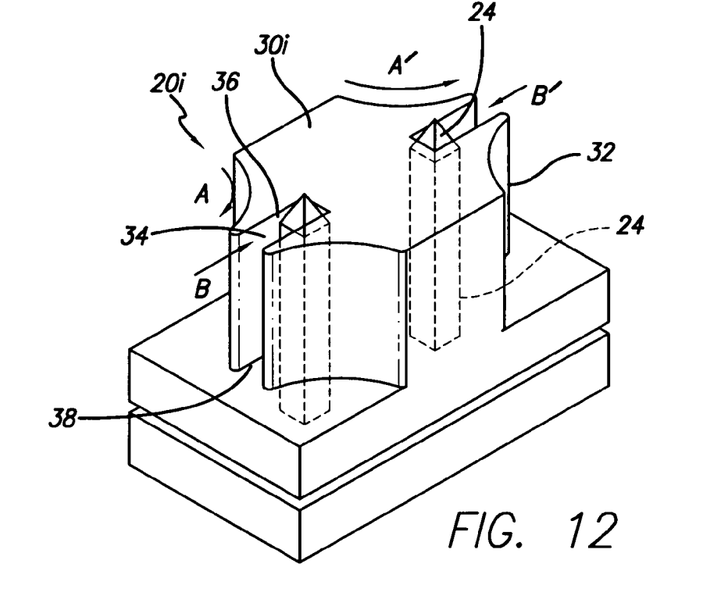
FIG. 12 is a perspective view of a tenth exemplary embodiment of a guide of the present invention having tip positioning capabilities.

FIG. 12 shows a tenth exemplary embodiment of a guide 20*i* of the present invention having tip positioning capabilities. Specifically, the guide 20*i* includes a guide insulator 30*i* that defines at least one passageway 34. This embodiment would function in much the same manner as the aforementioned examples, but would be particularly suitable for use with a pair of gripping probe tips 22 that are inwardly biased such that they tend to depress inward. Such a pair of gripping probe tips 22 can be temporarily forced outward, but when released will move inward and, in some embodiments, grip any item therebetween. Using such a pair of gripping probe tips 22, the probes are forced outward to grip the sides of the guide insulator 30*i* by moving the probe head, the probe tips 22 are forced further outward along the arrows A and A' until they reach respective passageways 34 at which time the tips 22 move inward along the arrows B and B'.

Figure 14:
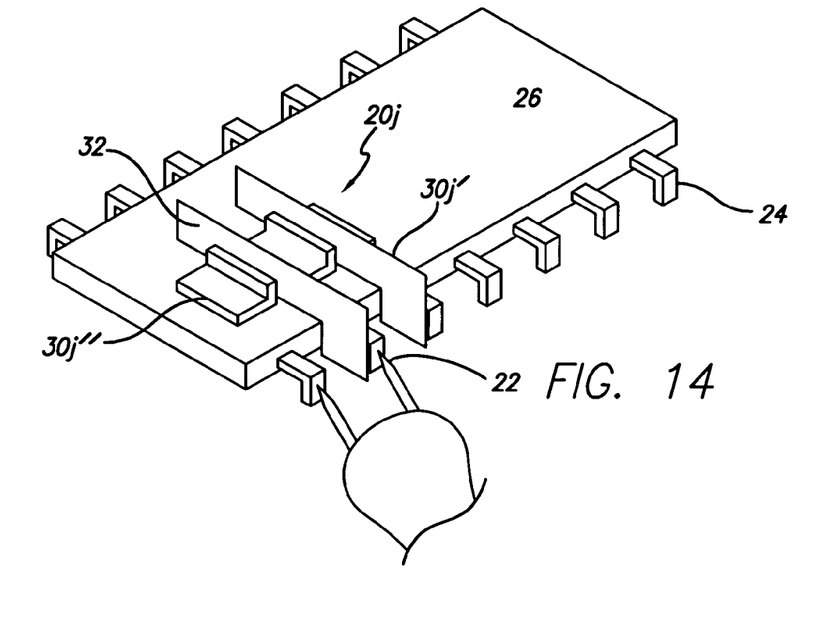
FIG. 14 is a perspective view of an eleventh exemplary embodiment of a guide of the present invention having at least one divider guide insulator supported by a mounting apparatus.
Figure 15:
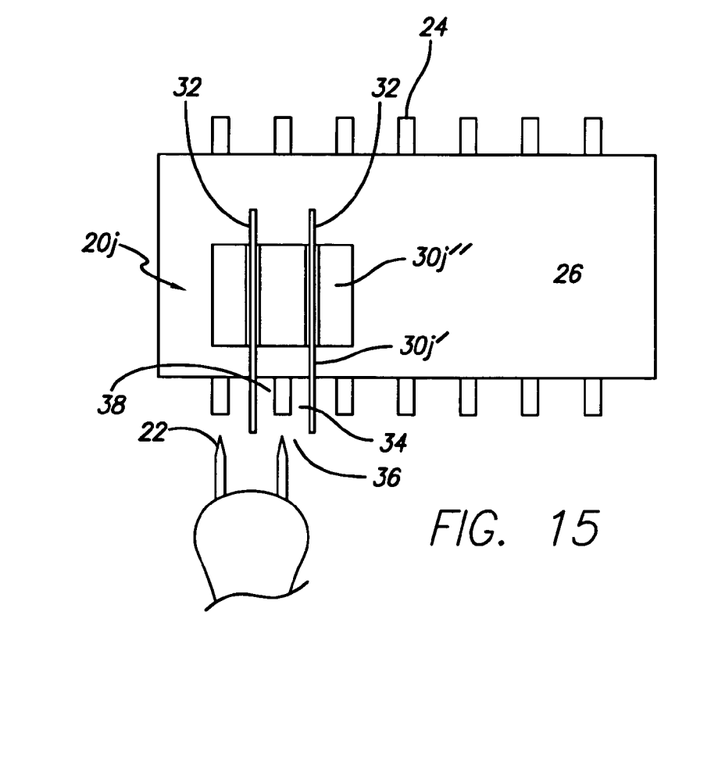
FIG. 15 is a top view of the eleventh exemplary embodiment of a guide shown in FIG. 14.
Figure 18:
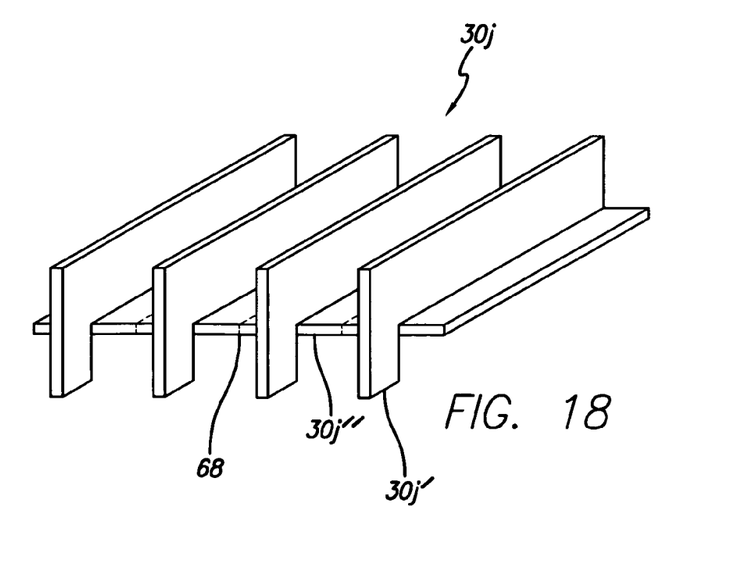
FIG. 18 is a perspective view of a set of divider guide insulators supported by respective integral mounting apparatus, the mounting apparatus being perforated for easy division.

FIGS. 14 and 15 show an eleventh exemplary embodiment of a guide 20*j* of the present invention having at least one divider guide insulator 30*j'* that may be supported by a mounting apparatus 30*j'''*. The divider guide insulators 30*j'* are preferably thin flexible insulating material that can index between close transmission paths 24. Although shown in an "L" shape, alternate embodiments could have a different shape, particularly if the mounting apparatus 30*j'''* extends beyond the periphery of the circuit board component 26. Although the divider guide insulators 30*j'* and the mounting apparatus 30*j'''* are shown as separate units, alternative embodiments could have them as an integral unit (FIG. 18). The mounting apparatus 30*j'''* may have temporary or permanent adhesive on its lower side to assist in the mounting thereof. The divider guide insulators 30*j'* have at least one insulated exterior surface 32. The insulated exterior surface 32 prevents short-circuiting with adjacent transmission paths 24. The at least one divider guide insulator 30*j'* defines a passageway 34 therebetween. Each passageway 34 has a first tip passageway end 36 and a second transmission path passageway end 38. In this embodiment, the first tip passageway end 36 is relatively close to the second transmission path passageway end 38. The first passageway end 36 is suitable for accommodating a tip 22. The first tip passageway end 36 would help to guide and secure the tip 22 within the first tip passageway end 36. The second passageway end 38 is suitable for accommodating a transmission path 24. The tip 22 contacts the transmission path 24 through the passageway 34 when the tip 22 is positioned in the first passageway end 36 and the transmission path 24 is positioned within the second passageway end 38. Alternative embodiments of this embodiment may include one or many passageways 34. Still other alternative embodiments may have a mounting apparatus 30*j'''* of variable length in which it may be divided (perhaps by cutting, scoring, or perforation) or joined (using connection apparatus) with other mounting apparatus 30*j'''*.

Figure 16:
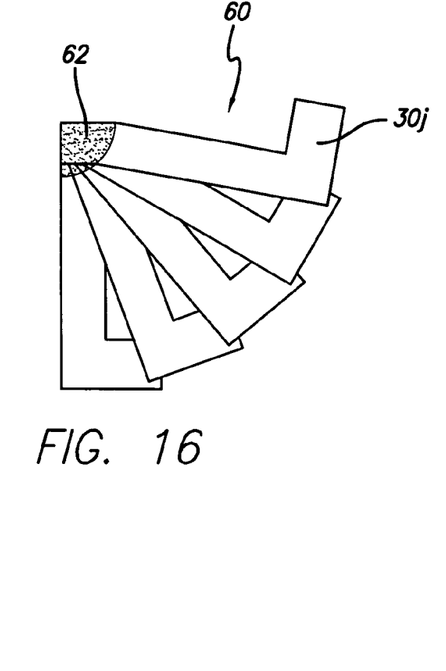
FIG. 16 is a plan view of a stack of divider guide insulators removably interconnected.

FIG. 16 shows a stack 60 of divider guide insulators 30*j'* removably interconnected. As mentioned above, the divider guide insulators 30*j'* are preferably thin flexible insulating material that can index between close transmission paths 24. In one preferred embodiment of the present invention, the divider guide insulators 30*j'* are supplied to end users as a stack 60 of divider guide insulators 30*j'* that have adhesive or other connection means 62 at one end. As the end user needs a divider guide insulator 30*j'*, he merely peels or otherwise removes it from the stack 60. It should be noted that the size, dimensions, and shape of the divider guide insulators 30*j'* is meant to be exemplary and is not meant to limit the scope of the invention.

Figure 17:
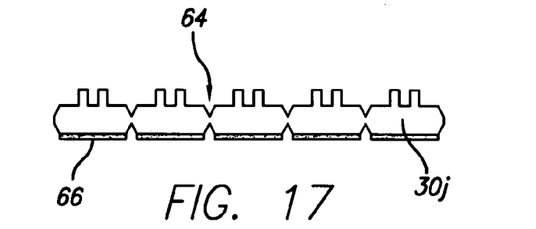
FIG. 17 is an end view of a mounting apparatus that is dividable.

FIG. 17 shows a mounting apparatus 30*j'''* that is dividable. In this embodiment, the end user is supplied with a strip or a roll of mounting apparatus 30*j'''*. FIG. 17 shows scoring 64 on both sides of the mounting apparatus 30*j'''* that may be used for dividing the mounting apparatus 30*j'''*. The user may use only one mounting apparatus 30*j'''* or many mounting apparatus 30*j'''*. It should be noted that the design, size, dimensions, and shape of the mounting apparatus 30*j'''* is meant to be exemplary and is not meant to limit the scope of the invention. In fact, alternative mounting apparatus 30*j'''* may be used. FIG. 17 also shows a layer of adhesive 66 that could be used to secure the mounting apparatus 30*j'''* to the surface of circuit board component 26.

FIG. 18 shows a set of divider guide insulators 30*j'* supported by respective integral mounting apparatus 30*j'''*. The integral divider guide insulators 30*j'* and mounting apparatus 30*j'''* are jointly referred to as insulator 30*j*. The mounting apparatus 30*j'''* in this embodiment has longitudinal perforations 68 perforated for easy division.

Figure 19:
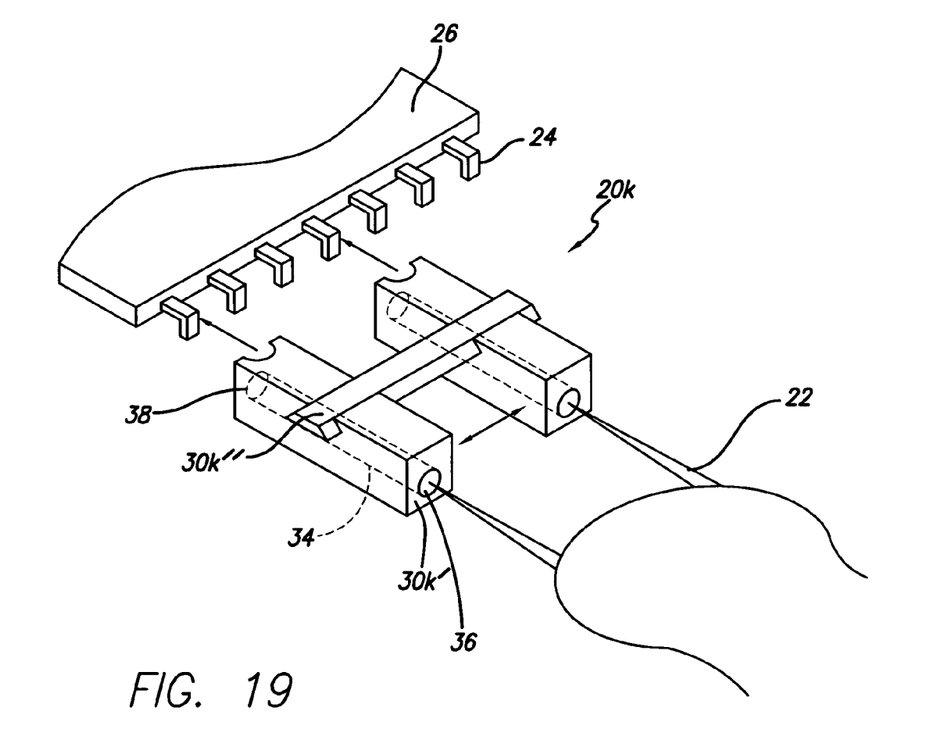
FIG. 19 is a perspective view of a twelfth exemplary embodiment of a guide of the present invention having adjustable guide insulators.

FIG. 19 shows a twelfth exemplary embodiment of a guide 20*k* of the present invention having adjustable guide insulators 30*k'* that may be joined by an adjustment apparatus 30*k''*. This embodiment would function in much the same manner as the embodiments shown in FIGS. 9–11. Specifically, the guide 20*k* includes at least one guide insulator 30*k'* that defines at least one passageway 34. The guide insulators 30*k'* are adjustably mounted and interconnected with the adjustment apparatus 30*k''*. In alternative embodiments the passageways themselves could be adjusted in relation to each other. Using the guide 20*k* the positions of the guide insulators 30*k'* can be adjusted to accommodate the probing of transmission paths 24 having various spacing therebetween. Adjustability would be useful if the user wanted to temporarily probe two adjacent transmission paths 24 and then later probe two transmission paths 24 that are spaced apart or have additional transmission paths 24 therebetween. Adjustability would also be useful if the user wanted one guide 20*k* that could probe a variety of circuit board components 26 having a variety of transmission path sizes and spacing. The guide insulators 30*k'* may also be removably and replaceably mounted and interconnected with the adjustment apparatus 30*k''*. In some alternative embodiments the guide insulators 30*k'* may be locked at a particular distance on the adjustment apparatus 30*k''*. Although the adjustment apparatus 30*k''* is shown on the top side of the guide insulators 30*k'*, an alternative embodiment would put the adjustment apparatus 30*k''* on the bottom side (so it could also be used as a mounting apparatus). Exemplary alternative embodiments of the adjustment apparatus 30*k''* could include rails, screws, poles, and wires.

The features discussed with the shown embodiments may be combined to form still other embodiments. For example, the first passageway ends 36 shown in FIGS. 3–5 may be added to the embodiments shown in FIGS. 1 and 6–13. Another example is that the contact enhancing mechanisms 50, 52, 54 may be added to the embodiments shown in FIGS. 1–5 or 9–13. Still further, embodiments may be adapted for any number of transmission paths 24. Many of the embodiments may be made adjustable.

It should be noted that the shape of the passageway 34 might be adapted for a particular use. For example, the passageway 34 shape may be square, circular, conical, or rectangular in cross-section to accommodate a similarly shaped transmission path 24 and/or tip 22. Similarly, the length of the passageway 34 may be adapted to accommodate different transmission paths 24 and/or tips 22. The interior surface of the passageway 34 may include additional mechanisms (e.g. ridges, conductive coatings, and/or insulating coatings) depending on the desired use.

Additional passageways 34 may be added. By using only a few passageways 34, the guides 20 are able to be placed in smaller spaces and may be usable with more types of circuit board components 26. In other alternative embodiments, guides 20 may be constructed that are specific to particularly sized and shaped circuit board components 26.

Alternative embodiments of the guides 20 may include times, hooks, straps, adhesive, or additional connection apparatus to help hold the guide 20*g* in place. Alternative embodiments of the guides 20 may include times, projections, positioning guides, or additional positioning apparatus to help guide the guide 20*g* in place.

Similarly, it should be noted that the size and shape of the contact enhancing mechanisms 50, 52, 54 may be adjusted without affecting the scope of the present invention. Additional features such as ridges, divots, or coatings may be added to the contact enhancing mechanisms 50, 52, 54 without affecting the scope of the present invention.

Additional features of the guides 20 of the present invention may include adapters to accommodate specific tips, mechanisms (e.g. connectors) to connect multiple guides, mechanisms (e.g. add-ons) to elongate the guides 20, mechanisms (e.g. add-ons or tubes) to elongate the passageways 34, and mechanisms (e.g. inserts) to change the shape the passageways 34.

The terms and expressions that have been employed in the foregoing specification are used as terms of description and not of limitation, and are not intended to exclude equivalents of the features shown and described or portions of them. The scope of the invention is defined and limited only by the claims that follow.

What is claimed is:

1. A method for using a guide for tip to transmission path contact, said method comprising the steps of:
    (a) providing at least one guide insulator having at least one passageway defined by said at least one guide insulator, said at least one passageway having a tip passageway end and a transmission path passageway end, said tip passageway end suitable for at least partially accommodating said tip, said transmission path passageway end suitable for at least partially accommodating a transmission path, said at least one guide insulator having at least one passageway that includes a contact enhancing mechanism;
    (b) interconnecting said guide insulator with a circuit board component having at least one transmission path such that said transmission path is at least partially accommodated within said transmission path passageway, interconnecting said contact enhancing mechanism with said at least one transmission path; and
    (c) probing said transmission path by inserting a tip of an electronic test probe into said tip passageway end and touching said tip to said contact enhancing mechanism, such that said tip electrically contacts said transmission path.

2. The method of claim 1, wherein step (c) is performed after step (b).

3. The method of claim 1, further comprising the step of removing said tip of said electronic test probe while said guide insulator remains interconnected with said circuit board component.

4. The method of claim 1, said step of providing at least one guide insulator further comprising the step of providing at least one guide insulator that is removably interconnectable with a circuit board component having at least one transmission path.

5. The method of claim 1, wherein using said guide in steps (b) and (c) facilitates relatively secure contact between said tip and said transmission path.

6. The method of claim 1, said tip passageway end guiding said tip towards said transmission path.

7. A method for using a guide for tip to transmission path contact, said method comprising the steps of:
    (a) providing at least one guide insulator having at least one passageway defined by said at least one guide insulator, said at least one passageway having a tip passageway end and a transmission path passageway end, said tip passageway end suitable for at least partially accommodating said tip, said transmission path passageway end suitable for at least partially accommodating a transmission path;
    (b) interconnecting said guide insulator with a circuit board component having at least one transmission path such that said transmission path is at least partially accommodated within said transmission path passageway; and
    (c) probing said transmission path by inserting a tip of an electronic test probe into said tip passageway end such that said tip electrically contacts said transmission path;
    (d) wherein step (c) is performed after step (b).

8. The method of claim 7, said step of providing at least one guide insulator further comprising the step of providing at least one guide insulator having at least one passageway that includes a contact enhancing mechanism.

9. The method of claim 7, further comprising the step of removing said tip of said electronic test probe while said guide insulator remains interconnected with said circuit board component.

10. The method of claim 7, said step of providing at least one guide insulator further comprising the step of providing at least one guide insulator that is removably interconnectable with a circuit board component having at least one transmission path.

11. The method of claim 7, wherein using said guide in steps (b) and (c) facilitates relatively secure contact between said tip and said transmission path.

12. The method of claim 7, said tip passageway end guiding said tip towards said transmission path.

13. A method for using a guide for tip to transmission path contact, said method comprising the steps of:
    (a) providing at least one guide insulator having at least one passageway defined by said at least one guide insulator, said at least one passageway having a tip passageway end and a transmission path passageway end, said tip passageway end suitable for at least partially accommodating said tip, said transmission path passageway end suitable for at least partially accommodating a transmission path;
    (b) interconnecting said guide insulator with a circuit board component having at least one transmission path such that said transmission path is at least partially accommodated within said transmission path passageway; and
    (c) probing said transmission path by inserting a tip of an electronic test probe into said tip passageway end such that said tip electrically contacts said transmission path.

14. The method of claim 13, said step of providing at least one guide insulator further comprising the step of providing at least one guide insulator having at least one passageway that includes a contact enhancing mechanism.

15. The method of claim 14, said step of providing at least one guide insulator having at least one passageway that includes a contact enhancing mechanism further comprising the step of providing at least one guide insulator having at least one passageway having a contact enhancing mechanism selected from a group consisting of:

(a) solid contact enhancing mechanism;
(b) combination contact enhancing mechanism; and
(c) soft contact enhancing mechanism.

16. The method of claim 13, further comprising the step of removing said tip of said electronic test probe while said guide insulator remains interconnected with said circuit board component.

17. The method of claim 13, said step of providing at least one guide insulator further comprising the step of providing at least one guide insulator that is removably interconnectable with a circuit board component having at least one transmission path.

18. The method of claim 13, wherein said transmission path is at least partially accommodated within said transmission path passageway before said tip of an electronic test probe it inserted into said tip passageway end.

19. The method of claim 13, wherein using said guide in steps (b) and (c) facilitates relatively secure contact between said tip and said transmission path.

20. The method of claim 13, said tip passageway end guiding said tip towards said transmission path.

21. The method of claim 13, wherein said step of providing at least one guide insulator further comprises the step of providing at least one guide insulator having a tip passageway end with at least one guide enhancing mechanism selected from the group consisting of:

(a) a funnel shaped opening; and
(b) an enlarged, partial funnel shaped opening.

22. The method of claim 13, wherein said step of providing at least one guide insulator having at least one passageway further comprises the step of providing at least one guide insulator having fewer passageways than the number of transmission paths of the device to be probed.

23. The method of claim 13, wherein said step of providing at least one guide insulator having at least one passageway further comprises the step of providing at least one guide insulator having two passageways.

24. The method of claim 13, wherein said step of providing at least one guide insulator further comprises the step of providing at least one guide insulator having at least one mounting apparatus and at least one divider guide insulator, each divider guide insulator positionable between close transmission paths.

25. The method of claim 13, wherein said step of providing at least one guide insulator further comprises the step of providing at least two guide insulators, said at least two guide insulators being adjustable in relation to each other.

* * * * *